(12) United States Patent
Mullen et al.

(10) Patent No.: US 10,049,852 B2
(45) Date of Patent: Aug. 14, 2018

(54) ASSESSMENT AND CALIBRATION OF A HIGH ENERGY BEAM

(71) Applicant: Howmedica Osteonics Corp., Mahwah, NJ (US)

(72) Inventors: Lewis Mullen, Merseyside (GB); Joseph Robinson, Lancashire (GB)

(73) Assignee: Howmedica Osteonics Corp., Mahwah, NJ (US)

( * ) Notice: Subject to any disclaimer, the term of this patent is extended or adjusted under 35 U.S.C. 154(b) by 230 days.

(21) Appl. No.: 14/932,528

(22) Filed: Nov. 4, 2015

(65) Prior Publication Data

US 2016/0124026 A1 May 5, 2016

Related U.S. Application Data

(60) Provisional application No. 62/075,584, filed on Nov. 5, 2014.

(51) Int. Cl.
*H01J 37/02* (2006.01)
*H01J 37/244* (2006.01)

(52) U.S. Cl.
CPC ............ *H01J 37/02* (2013.01); *H01J 37/244* (2013.01); *H01J 2237/24405* (2013.01); *H01J 2237/30477* (2013.01); *H01J 2237/3114* (2013.01); *H01J 2237/3128* (2013.01)

(58) Field of Classification Search
CPC . H01J 37/02; H01J 37/244; H01J 2237/24405
See application file for complete search history.

(56) References Cited

U.S. PATENT DOCUMENTS

| | | |
|---|---|---|
| 5,483,036 A | 1/1996 | Giedt et al. |
| 5,583,427 A | 12/1996 | Teruya et al. |
| 5,657,138 A | 8/1997 | Lewis et al. |
| 6,300,755 B1 | 10/2001 | Elmer et al. |
| 6,977,382 B2 | 12/2005 | Lower |
| 7,537,722 B2 | 5/2009 | Andersson et al. |
| 7,902,503 B2 | 3/2011 | Teruya et al. |

(Continued)

OTHER PUBLICATIONS

ARCAM Q10 User Manual, 338 pages, Feb. 2014.
SciMet, LLC, Metallurgical Consulting Services, <http://www.scimet.com/products.html>, printed Dec. 7, 2015.

*Primary Examiner* — Hugh H Maupin
(74) *Attorney, Agent, or Firm* — Lerner, David, Littenberg, Krumholz & Mentlik, LLP

(57) ABSTRACT

A high energy beam verification, calibration, and profiling system includes a conductive base plate, supports extending from the base plate, a plurality of conductors, a data logger electrically connected to the conductors, and a computer electrically connected to the data logger. Each conductor is supported by some of the supports such that each conductor is insulated from the conductive base plate. Each conductor has a profile intersecting with profiles of at least some of the other conductors to define a multidirectional and two-dimensional array of conductors. The data logger receives and records data associated with electrical charges flowing through the conductors. The computer is adapted to receive, manipulate, and display the data recorded by the data logger for comparison of beam characteristics at different locations across a high energy beam build area.

19 Claims, 10 Drawing Sheets

(56) References Cited

U.S. PATENT DOCUMENTS

| | | |
|---|---|---|
| 7,982,179 B2 | 7/2011 | Adamec et al. |
| 8,330,104 B2 | 12/2012 | Matsumoto |
| 8,530,851 B2 | 9/2013 | Abgaryan et al. |
| 8,845,316 B2 | 9/2014 | Schillen et al. |
| 9,347,794 B1 | 5/2016 | Tiana et al. |
| 9,383,460 B2 | 7/2016 | McAninch et al. |
| 2013/0134323 A1* | 5/2013 | Abgaryan ............ H01J 37/244 250/396 R |
| 2015/0100149 A1 | 4/2015 | Coeck et al. |

* cited by examiner

ASSESSMENT AND CALIBRATION OF A HIGH ENERGY BEAM

CROSS-REFERENCE TO RELATED APPLICATIONS

The present application claims the benefit of the filing date of U.S. Provisional Patent Application No. 62/075,584 filed Nov. 5, 2014, the disclosure of which is hereby incorporated herein by reference.

FIELD OF THE INVENTION

The present invention relates generally to high energy beams used in additive manufacturing, and in particular relates to the analysis, calibration, and profiling of such beams.

BACKGROUND OF THE INVENTION

Focused high energy beams, including electron beams (also referred to as "e-beams") and laser beams have been used to melt layers of metallic powder, resulting in the generation of complex geometries. The quality and consistency of a high energy beam is one of the most important factors in determining the final quality of components manufactured using high energy beam melting processes. The generation and control of a high energy beam is a rather complex process. Two current methods used for assessing the quality of an e-beam for use with an electron beam melting (EBM) process are the enhanced modified Faraday cup (EMFC) electron beam welding diagnostic and the beam verification processes.

Referring to FIG. 1, the EMFC system receives a high energy beam through thin slits on the top of a tungsten disc to effectively measure the beam's current, size, shape and peak power distribution. This system has generated a significant amount of informative data regarding beam parameters, including beam quality and previously unquantifiable beam interference factors. This data has led to a deeper understanding into the EBM process and specifically how a high energy beam interacts with the powder bed to form a consistent melt pool. However, a major limitation with the EMFC system is that, due to the requirement for a beam undergoing testing to enter the tungsten disc at a specific angle, the EMFC is only able to analyze the beam in the center of a build area. This limitation leads to an assumption that the measured beam characteristics are accurately replicated across an entire build area over which a beam will travel during manufacturing of a component.

Referring now to FIG. 2, in the beam verification process, a beam is scanned across a stainless steel plate at relatively low beam energies, forming a number of predefined patterns. This process allows for limited beam characterization across an entire build area but is not sensitive to small changes in beam quality that may produce notable effects during an EBM process. This process merely serves as a verification that beam intensity and focus set points are in approximately the correct region in selected areas of the plate. However, the quantity of data generated by this process is insufficient to be used in the manufacture of reliably and reproducibly high quality components.

The calibration of the beam focusing system is an important step that in essence dictates the dimensional accuracy and mechanical properties of a manufactured component. Beam calibration is a manually intensive process that is intended to ensure that the beam demonstrates the smallest spot size, most circular beam and highest intensity at any specified point across the build area. There is no constraint that the beam size, circularity, and intensity at each position are the same. This could mean that although the beam is as intense as possible at each calibration location, there may be variation across the bed, and just as importantly between machines. A further weakness of the beam calibration procedures is their dependence on operator skill leading to significant potential for error and lack of repeatability between successive beam calibrations.

Therefore, there is a need to improve the high energy beam diagnostic process to provide high resolution beam information across entire build areas under representative processing conditions.

SUMMARY OF THE INVENTION

By implementing innovative hardware and software solutions, the current e-beam analysis and verification techniques can be improved upon to measure and generate useable data regarding high energy beam characteristics across an entire build area to enhance, optimize, and ensure repeatability of any beam calibration procedure as well as the reliability and reproducibility of components manufacturing using high energy beam systems.

A novel application of an Enhanced Wire-Array (EWA) High Energy Beam Analyzer system is for use in beam calibration processes, where it would allow for accurate, highly reproducible and non-user dependent beam calibrations. A significant benefit of using this system is that it can be transferred between machines to allow consistent beam analysis and repeatable calibration across multiple machines. This new process of beam calibration will ensure that a calibrated beam demonstrates consistent spot size, circularity, and intensity across an applicable processing area of an individual machine as well as between multiple machines, even if the desired spot size is not a minimum spot size and/or the intensity is not the maximum intensity.

In accordance with an aspect of the invention, a system for quickly and accurately measuring parameters of a high energy beam includes hardware and software packages that measure at least the parameters of current, shape, size, peak power distribution (PPD), and position of a high energy beam. The system may be adapted to accurately measure such parameters at beam powers at least between 50 W and 100 kW. The system may be adapted to accurately measure the parameters across an applicable processing area. The system may be adapted to accurately measure the parameters at speeds representative of normal processing conditions. In some arrangements, such speeds may be up to 100,000 mm/s. The system may be adapted to resolve beam diameters of between 10 μm and 2000 μm to a resolution of at least to +/−5 μm. The system may be set up accurately and with ease relative to a beam focal plane and X-Y coordinate system. The system may produce repeatable and reproducible results with respect to the beam focal plane.

In accordance with another aspect of the invention, a method includes traversing a high energy beam over a thin electrical conductor having a known profile, such as a wire of known diameter. The high energy beam may traverse the conductor in a direction that is approximately perpendicular to the conductor at a known speed. The conductor may be made from any of tungsten, tantalum, tungsten-rhenium, or other refractory metals, or a combination of these metals, and in preferred arrangements is made of tungsten. The conductor diameter may be in the range of between 5 μm and 500 μm, depending on the approximate beam power and diameter that is being measured. A voltage drop over a known resistance may be measured by a data logger as the beam traverses the conductor. A beam current of the beam as it interacts with the conductor may be determined using the equation I=V/R. In the case of a perfectly circular beam profile, as the beam traverses the conductor, the calculated beam current increases until the maximum beam diameter is reached, at which point the calculated beam current decreases until the beam is no longer in contact with the conductor, as depicted in the example of FIG. 3 discussed further herein. By applying a number of software algorithms, the beam diameter, beam current and astigmatism parameters may be calculated, displayed and post-processed.

In some arrangements, the system may include an insulating base plate having a conductive, protective top surface. Push fit pins may be inserted into the insulating plate. In such arrangements, the push fit pins may protrude through but not be in contact with the protective top surface. The refractory metal conductor may be connected to the push fit pins. When the beam is not traversing the conductors, the system may be adapted to scan over the protective top surface of the plate. In this manner, damage to the insulating base plate may be prevented, and the beam may be grounded effectively.

In some arrangements, the high energy beam may be analyzed at specific locations across an applicable processing area by arranging a plurality of thin conductors, such as wires, in varying directions to form one or more arrays within a specially designed plate. Examples of such arrays can be seen in FIGS. 8-14 described further herein.

In accordance with an aspect of the invention, an automatic beam calibration procedure for use with an EBM system would follow the flow diagram presented in FIG. 15 described further herein. As that flow diagram represents a typical process, the process can essentially be applied to any high energy beam machine.

In accordance with an aspect of the invention, a beam calibration plate may be securely located so that the plate may act as and define datums that align with datums that may be defined by a high energy beam machine being calibrated. Gases may be evacuated from a build chamber containing the beam calibration plate and the high energy beam machine. Subsequent to this evacuation process, the high energy beam may be turned on. Control software may manipulate a high energy beam produced by the high energy beam machine across thin electrical conductor arrays, such as the wire arrays described above, with varying astigmatism, focus and beam current settings. As the beam moves across each conductor at a set, process representative speed, the beam may induce an electrical current that flows through the conductor to ground. This current is determined by measuring a voltage drop across a known resistance between the measurement conductor and ground. The calculated beam current profile for each conductor pass is then used in conjunction with the known speed at which the beam was scanned across the conductor to reconstruct a one-dimensional beam profile. One-dimensional beam profiles for each conductor pass are combined to create two-dimensional beam profiles for each calibration location at each beam setting.

The measured beam profiles at each location are then compared to a specified desired beam profile, and the parameters that create a beam profile closest to this are selected and used for component manufacture. The desired beam profile is set such that it can be reproduced on every specific model of high energy beam machine.

In accordance with the present invention, beam positional calibration can also be incorporated into the new calibration procedure. Such positional calibration may be achieved by incorporating small holes (≤100% of the ideal beam spot size) at defined intervals across the protective surface of the calibration plate. These holes would pass through the calibration plate to a conductive under surface isolated from the top surface. Using raster scanning across each hole, the beam position that corresponds to the maximum measured current may be determined. As the exact location of each hole will be known, a highly accurate positional calibration can be attained. Additionally, positional calibration may be achieved by using conductors that may be positioned at known locations, and relating the position of the beam to locations when maximum intensity is measured.

The expected outcome of the calibration procedure is to generate a standardized ideal calibration distribution across the calibration area of each machine by manipulating the beam focusing system for selected process-representative beam parameters.

In accordance with an aspect of the invention, a high energy beam verification, calibration, and profiling system may include a conductive base plate, at least one support extending from the base plate, a plurality of conductors, a data logger, and a computer electrically connected to the data logger. Each conductor may be supported by at least one of the supports such that each conductor may be insulated from the conductive base plate and may have a profile intersecting with profiles of at least some of the other conductors to define a multidirectional and two-dimensional array of conductors. The data logger may be electrically connected to at least one of the conductors to receive and record data associated with electrical charges flowing through the one or more conductors. The computer may be adapted to receive, manipulate, and display the data recorded by the data logger for comparison of beam characteristics at different locations across a high energy beam build area.

In some arrangements, the high energy beam build area may correspond to the area of the conductive base plate.

In some arrangements, at least some of the conductors may be selected from the group consisting of a wire and a thin plate.

In some arrangements, at least one of the supports may be a thin plate. In some such arrangements, at least one aperture may extend through the thin plate. Each conductor may extend through any of the apertures.

In some arrangements, any of the supports may be a plurality of posts. In some such arrangements, each conductor may extend from different corresponding pairs of posts of the plurality of posts.

In some arrangements, the plurality of posts may be positioned around a perimeter of the base plate in a radial configuration.

In some arrangements, the plurality of posts may be positioned around a perimeter of the base plate in a rectangular configuration.

In some arrangements, any of the conductors may extend from its corresponding pair of posts of the plurality of posts at a same height at which another of the conductors may extend from its corresponding pair of posts of the plurality of posts.

In some arrangements, any of the conductors may extend from its corresponding pair of posts of the plurality of posts at a different height at which any other of the conductors may extend from its corresponding pair of posts of the plurality of posts.

In some arrangements, any conductor of a pair of conductors may be spaced apart from another conductor of the pair of conductors such that the pair of conductors may be insulated from each other. In some such arrangements, each of the plurality of conductors may be spaced apart from each of the other conductors of the plurality of conductors such that the plurality of conductors may be insulated from each other.

In some arrangements, at least one set of adjacent conductors of the plurality of conductors may be spaced apart a same distance as another set of adjacent conductors of the plurality of conductors may be spaced apart.

In some arrangements, at least one set of adjacent conductors of the plurality of conductors may be spaced apart a different distance as another set of adjacent conductors of the plurality of conductors may be spaced apart.

In some arrangements, the high energy beam verification, calibration, and profiling system may further include at least one first resistor of known resistance. Any such first resistors may be electrically connected to a conductor of the plurality of conductors and may be electrically connected to the data logger. In some such arrangements, the data may correspond to a voltage drop measured across any of the first resistors.

In some arrangements, at least one of the first resistors may have a same resistance as another of the first resistors.

In some arrangements, at least one of the first resistors may have a different resistance as another of the first resistors.

In some arrangements, the high energy beam verification, calibration, and profiling system may further include at least one second resistor of known resistance. Any such second resistors may be electrically connected to the conductive base plate and may be electrically connected to the data logger. In some such arrangements, the data may correspond to a voltage drop measured across any of the second resistors.

In some arrangements, at least some of the plurality of conductors may be arranged in a radial pattern.

In some arrangements, at least first and second sets of the plurality of conductors may be arranged in respective radial patterns.

In some arrangements, at least some of the plurality of conductors may be arranged in a grid pattern.

In some arrangements, at least first and second sets of the plurality of conductors may be arranged in respective grid patterns.

In another aspect of the invention, characteristics of a high energy beam may be verified, calibrated, and profiled. A high energy beam may be received over a plurality of conductors within a high energy beam build area. In such aspect, any of the conductors may be supported by at least one support that may extend from a conductive base plate such that any such conductor may be insulated from the conductive base plate and such that any such conductor may have a profile that may intersect with profiles of at least some of the other conductors to define a multidirectional and two-dimensional array of conductors. Further in such aspect, data may be displayed on a computer for comparison of beam characteristics at different locations across the high energy beam build area. The data may be associated with electrical charges flowing through at least one of the conductors.

In some arrangements, the high energy beam build area may correspond to the area of the conductive base plate.

In some arrangements, at least some of the conductors may be selected from the group consisting of a wire and a thin plate.

In some arrangements, at least one of the supports may be a thin plate. In some such arrangements, at least one aperture may extend through the thin plate. Each conductor may extend through any of the apertures.

In some arrangements, any of the supports may be a plurality of posts. In some such arrangements, each conductor may extend from different corresponding pairs of posts of the plurality of posts.

In some arrangements, the plurality of posts may be positioned around a perimeter of a base plate in a radial configuration. In such arrangements, the base plate may be conductive.

In some arrangements, the plurality of posts may be positioned around a perimeter of a base plate in a rectangular configuration. In such arrangements, the base plate may be conductive.

In some arrangements, any of the conductors may extend from its corresponding pair of posts of the plurality of posts at a same height at which another of the conductors may extend from its corresponding pair of posts of the plurality of posts.

In some arrangements, any of the conductors may extend from its corresponding pair of posts of the plurality of posts at a different height at which any other of the conductors may extend from its corresponding pair of posts of the plurality of posts.

In some arrangements, any conductor of a pair of conductors may be spaced apart from another conductor of the pair of conductors such that the pair of conductors may be insulated from each other. In some such arrangements, each of the plurality of conductors may be spaced apart from each of the other conductors of the plurality of conductors such that the plurality of conductors may be insulated from each other.

In some arrangements, at least one set of adjacent conductors of the plurality of conductors may be spaced apart a same distance as another set of adjacent conductors of the plurality of conductors may be spaced apart.

In some arrangements, at least one set of adjacent conductors of the plurality of conductors may be spaced apart a different distance as another set of adjacent conductors of the plurality of conductors may be spaced apart.

In some arrangements, at least one first resistor of known resistance may be electrically connected to a conductor of the plurality of conductors and may be electrically connected to the data logger. In such arrangements, the data may correspond to a voltage drop measured across any of the first resistors.

In some arrangements, at least one of the first resistors may have a same resistance as another of the first resistors.

In some arrangements, at least one of the first resistors may have a different resistance as another of the first resistors.

In some arrangements, at least one second resistor of known resistance may be electrically connected to the conductive base plate and may be electrically connected to the data logger. In such arrangements, the data may correspond to at least a voltage drop measured across any of the second resistors.

In some arrangements, at least some of the plurality of conductors may be arranged in a radial pattern.

In some arrangements, at least first and second sets of the plurality of conductors may be arranged in respective radial patterns.

In some arrangements, at least some of the plurality of conductors may be arranged in a grid pattern.

In some arrangements, at least first and second sets of the plurality of conductors may be arranged in respective grid patterns.

DETAILED DESCRIPTION

Figure 1:
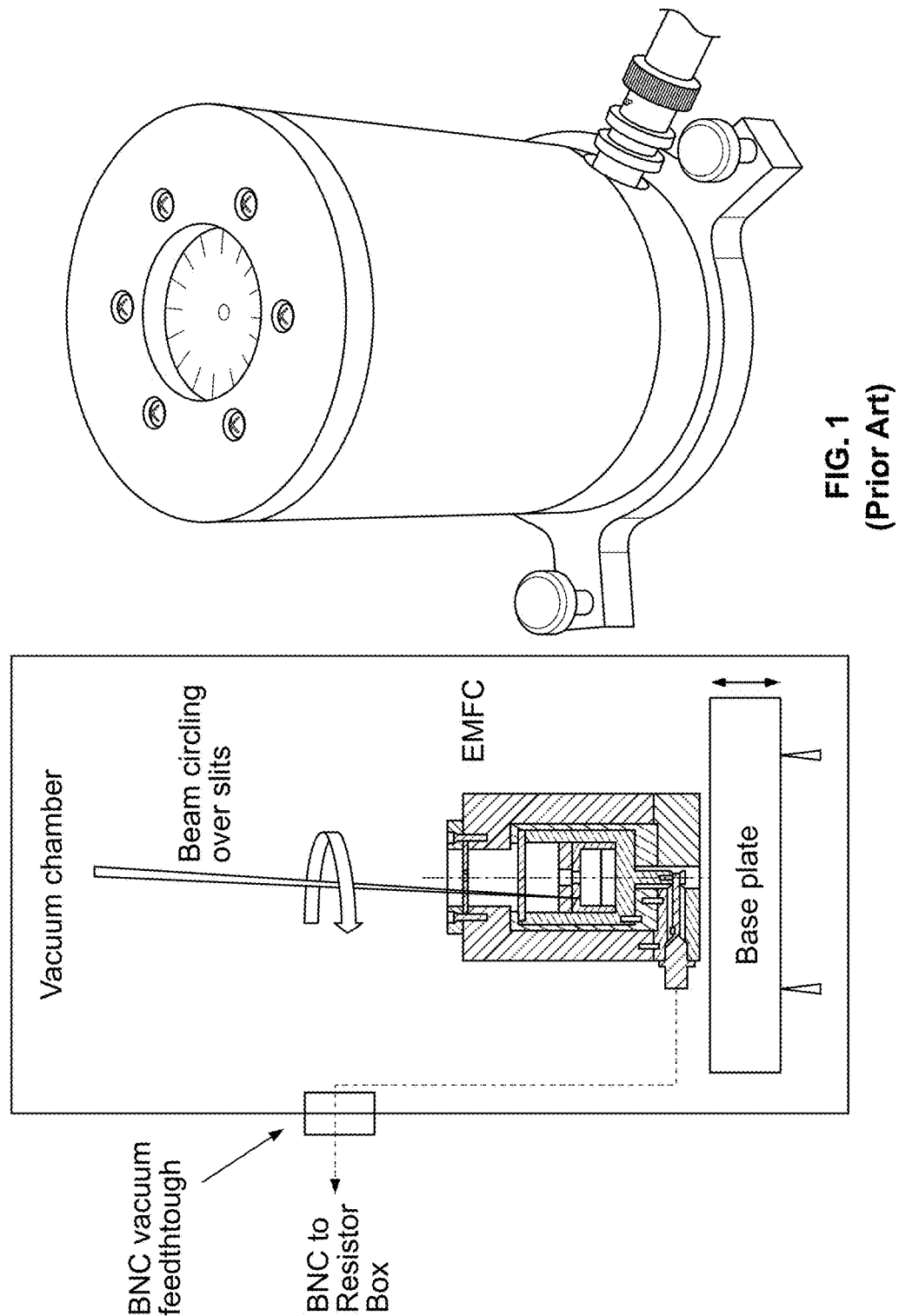
FIG. 1 is a schematic and photograph of an EMFC high energy beam analysis system.
Figure 2:
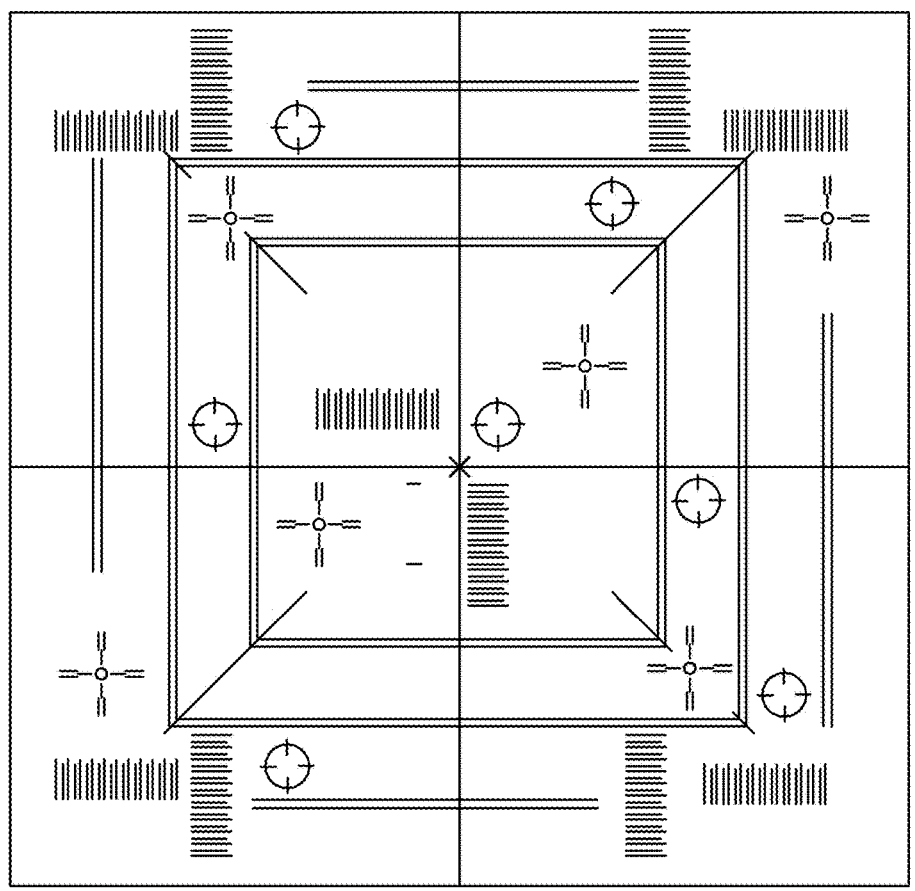
FIG. 2 is a photograph of an EBM beam verification plate.
Figure 3A:
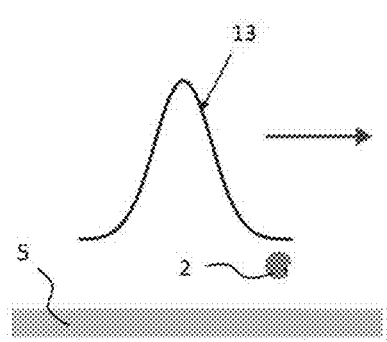
FIGS. 3A and 3B are schematics depicting measurements of a high energy beam traversing a thin wire over time in accordance with an embodiment.
Figure 3B:
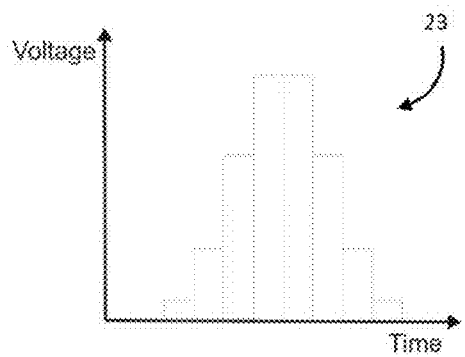

Referring to the drawings, as shown in FIGS. 3A and 3B, electron beam 13 may be translated over conductive plate 5, which may be but is not limited to steel, and may traverse thin cylindrical wire 2, which may be a tungsten wire, to produce a voltage drop. As shown in FIG. 3B, the voltage drop may increase as the high energy beam traverses thin wire 2 until the point of maximum energy crosses the thin wire 2, preferably as measured in a direction transverse to a longitudinal axis of thin wire 2.

Figure 4:
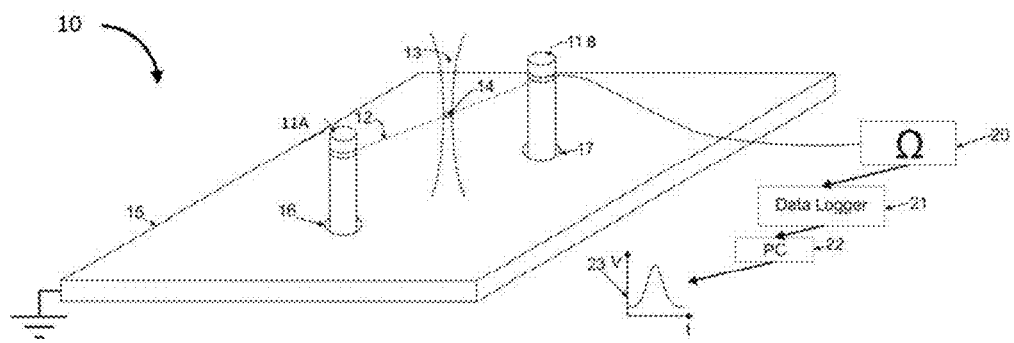
FIG. 4 is a perspective view of a high energy beam diagnostic profiling system in accordance with an embodiment.

As shown in FIG. 4, in a single wire high energy beam profiling apparatus 10 in accordance with an embodiment, thin wire 12 defining a profile thereof may be suspended between two pillars 11A, 11B and pass through conductive plate 15 which may be grounded. Thin wire 12 may be insulated from conductive plate 15 by either passing through holes 16, 17 in conductive plate 15 or passing through insulated pillars 11A, 11B. High energy beam 13 then may be scanned across thin wire 12 to cause a current to flow through thin wire 12. Thin wire 12 may be connected, such as by a bond wire or other hardwired connection to resistor 20 having a known resistance. In this manner, the current through thin wire 12 may be determined by measuring a voltage drop across resistor 20. The voltage drop across resistor 20 may be logged using a data logger 21 which may be connected, by wire or wirelessly, to and communicate with computer 22, which may be but is not limited to being a personal computer (PC), through a wired or wireless connection. In this manner, chart 23 of the measured voltage against time may be plotted and the current flowing through thin wire 12 at specific points in time may be calculated. If the speed at which high energy beam 13 was traveling when it passed over thin wire 12 is known, then a width and profile 14 of high energy beam 13 in the scanning direction can be calculated.

Figure 5:
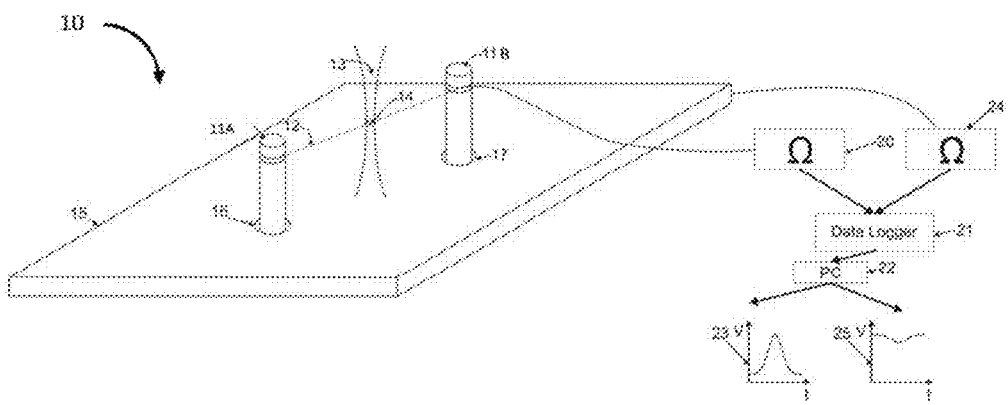
FIG. 5 is a perspective view of an alternative arrangement of the high energy beam diagnostic profiling system shown in FIG. 4.

As shown FIG. 5, conductive plate 15 may be wired to resistor 24. A voltage drop across resistor 24 then may be logged along with the voltage drop measured across resistor 20 using data logger 21 and stored in PC 22. In this manner, average beam current may be calculated during time intervals when high energy beam 13 is not crossing thin wire 12.

Figure 6:
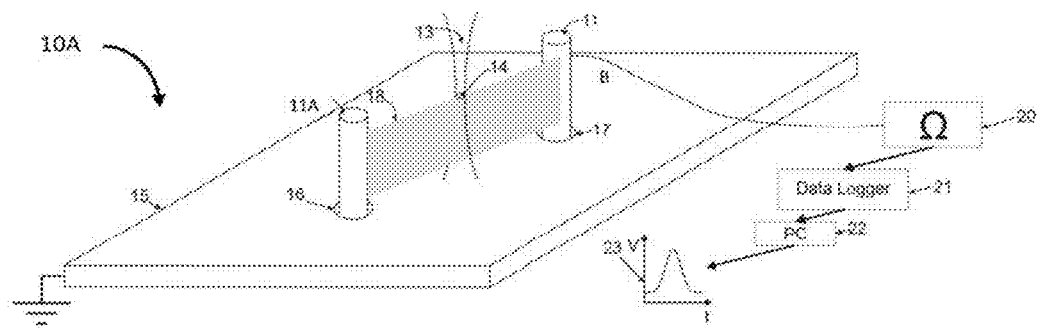
FIG. 6 is a perspective view of an alternative arrangement of the high energy beam diagnostic profiling system shown in FIG. 4.

Referring now to FIG. 6, in an alternative arrangement to that shown in FIG. 4, high energy beam profiling apparatus 10A may include thin wall 18, which may be a thin conductive plate, that may be suspended between pillars 11A, 11B in place of thin wire 12. Thin wall 18 may be made from any of tungsten, tantalum, tungsten-rhenium, or other refractory metals, or a combination of any of these metals, and in preferred arrangements is made of tungsten.

Figure 7:
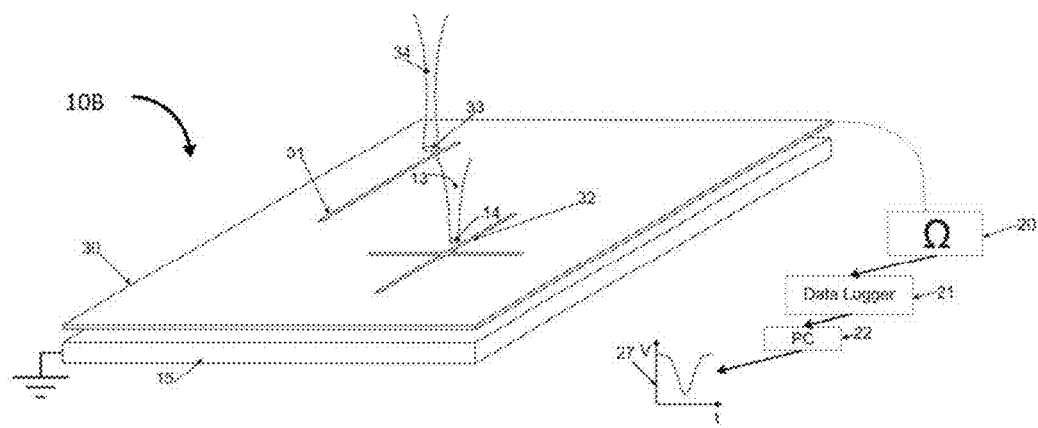
FIG. 7 is a perspective view a high energy beam diagnostic profiling system in accordance with an embodiment.

In an embodiment, as shown in FIG. 7, thin wire 12 may be replaced by any of single slit 31 and plurality of slits 32 formed in a pattern through thin sheet 30 placed over conductive bottom plate 15. As shown in this example, thin sheet 30 may be conductive such that resistor 20 may be connected to and receive electrical current by way of the thin sheet. In alternative arrangements, resistor 20 may be electrically connected to bottom plate 15 while thin sheet 30 is electrically connected to ground such that a voltage spike may be registered by data logger 21 when an electrical current is received by way of bottom plate 15.

Figure 8:
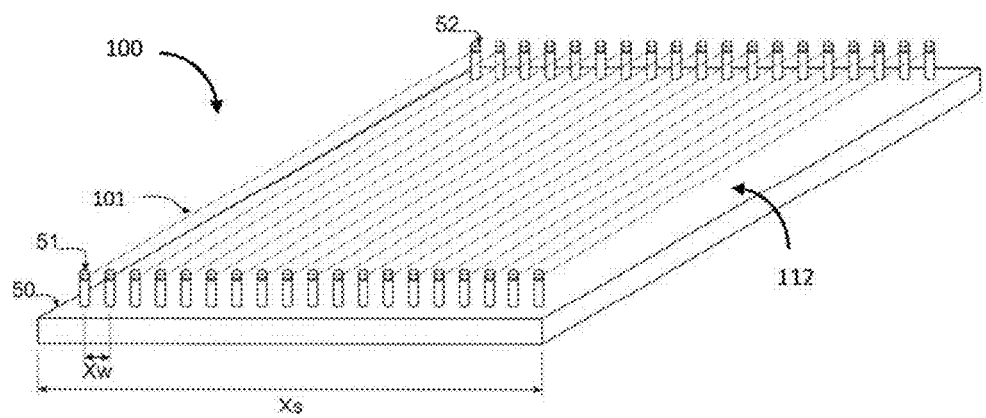
FIG. 8 is a perspective view of a high energy beam diagnostic profiling system in accordance with an embodiment.

As shown in FIG. 8, in accordance with an embodiment similar to that shown in FIGS. 4 and 5, high energy beam profiling apparatus 100 may include a plurality of single wires 101 defining associated profiles thereof that may be patterned to form a unidirectional and two-dimensional array 112 of wires such that measurements of high energy beam 13 may be made at multiple locations. A spacing between wires 101 may be greater than a diameter of high energy beam 13 being measured. As in this example, wires 101 of array 112 may be arranged such that wires 101 generally cover a full processing area of high energy beam 13 or a full surface area of conductive plate 50, which may be the same or substantially similar to conductive plate 15 described previously herein. In some arrangements, as in the example shown, the full processing area of the high energy beam and the full surface area of the conductive plate may be the same or at least substantially similar.

Figure 9:
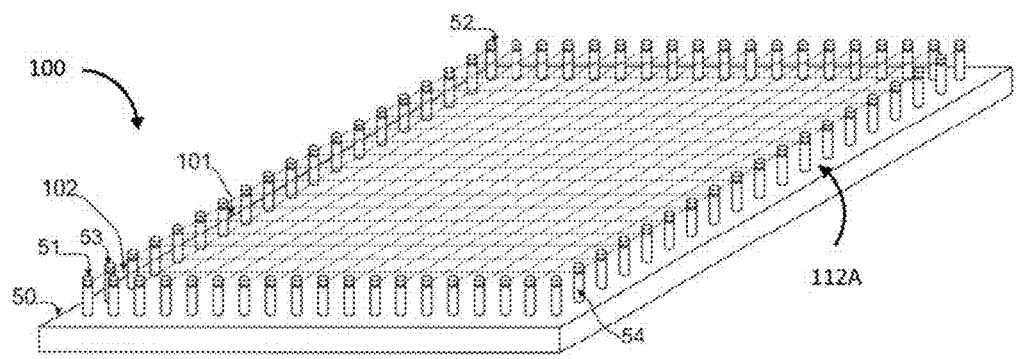
FIG. 9 is a perspective view of an alternative arrangement of the high energy beam diagnostic profiling system of FIG. 8.
Figure 10:
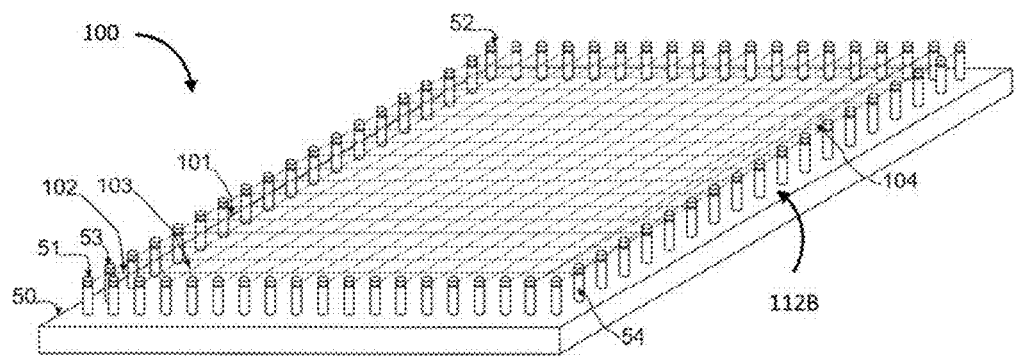
FIG. 10 is a perspective view of an alternative arrangement of the high energy beam diagnostic profiling system of FIG. 9.

In a modification of high energy beam profiling apparatus 100, as shown in FIG. 9, wires 101, 102 of bidirectional and two-dimensional array 112A defining associated profiles thereof may be suspended in an orthogonal directions between pillars 51, 52 and between pillars 53, 54, respectively, which may be arranged about a perimeter of conductive plate 15. In this manner, wires 101, 102 may cover a similar area to that described above with respect to unidirectional array 112 of wires of profiling apparatus 100. In a further modification of high energy beam profiling apparatus 100, as shown in FIG. 10, wires 103 may extend in a direction transverse to the direction of each of wires 101, 102 in tri-directional and two-dimensional array 112B. In the example shown, wires 103 extend between corresponding pillars 52, 53 such that wires 103 are parallel to each other and extend diagonal to wires 101, 102. Two-dimensional arrays as just described may enable high energy beam 13 to be measured in different planes and at different locations.

Figure 11:
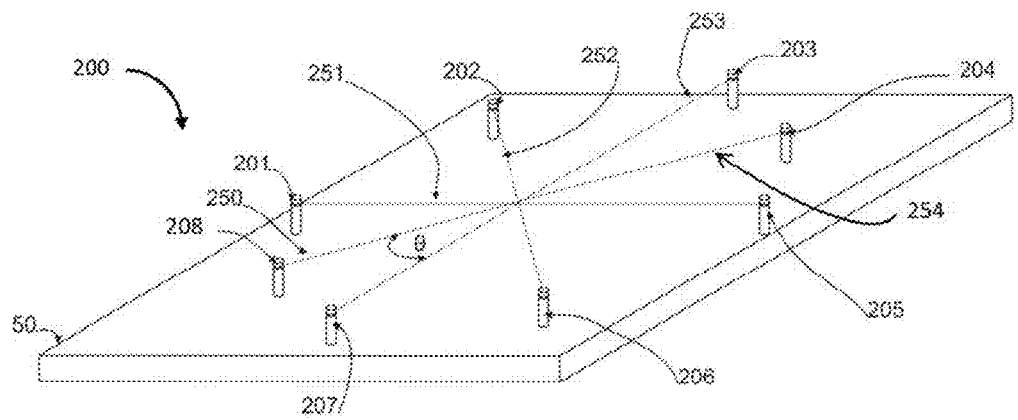
FIG. 11 is a perspective view of a high energy beam diagnostic profiling system having an array of wires set out in a radial pattern in accordance with an embodiment.

Referring now to FIG. 11, in accordance with a further embodiment similar to that shown in FIGS. 4 and 5, high energy beam profiling apparatus 200 may include an array of overlapping wires 251-254 that may be suspended between and may be supported by pins 201-208. As in this example, pins 201-208 may be patterned in a radial manner to give measurements in a plurality of planes each extending in different directions and intersecting along a line central to pins 201-208. In this manner, angular separation (θ) of wires 251-254 may be constant or vary between adjacent wires 251-254 to provide the desired measurement planes. As further shown, wires 251-254 may overlap at positions approximately along the line central to pins 201-208.

Figure 12:
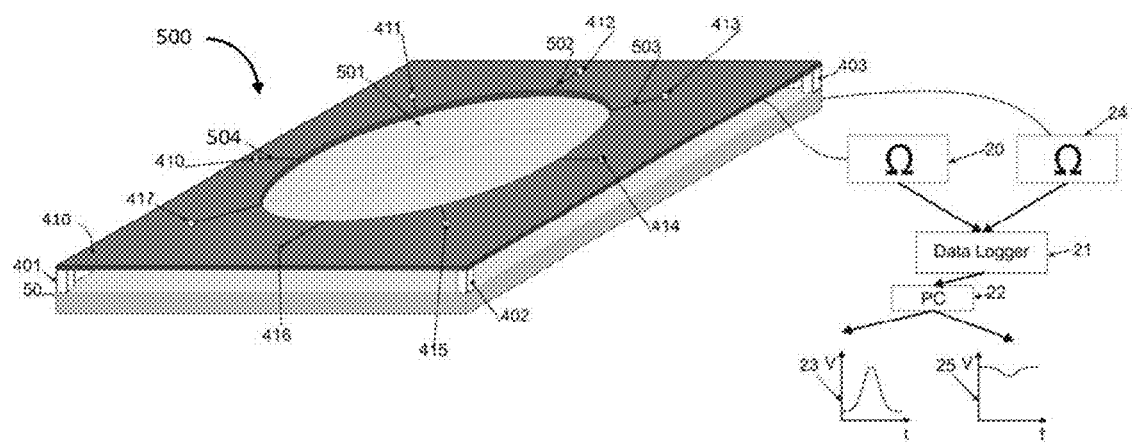
FIG. 12 is a perspective view of a high energy beam diagnostic profiling system in accordance with an embodiment.

As shown in FIG. 12, in accordance with another embodiment, wires 500-503 of high energy beam profiling apparatus 200 may be supported by thin conductive plate 400. As in this example, small holes 410-417 may be formed in thin plate 400 at precise locations. Wires 501-504 may be spaced apart and arranged in a pattern. Wires 501-504 may be but are not limited to being arranged in a radial pattern, as in the example shown. These wires 501-504 further may be passed through small holes 410-417 to provide mechanical support for wires 501-504. Thin plate 400 may be raised above and may be isolated from conductive plate 50 by insulating pillars 401-403 and another pillar hidden in the drawing view, which may be under each corner of conductive plate 50. The predetermined precise location of small holes 410-417, and therefore wires 501-504, allows for calibration of the position of the high energy beam as well as calibration of the beam profile.

Figure 13:
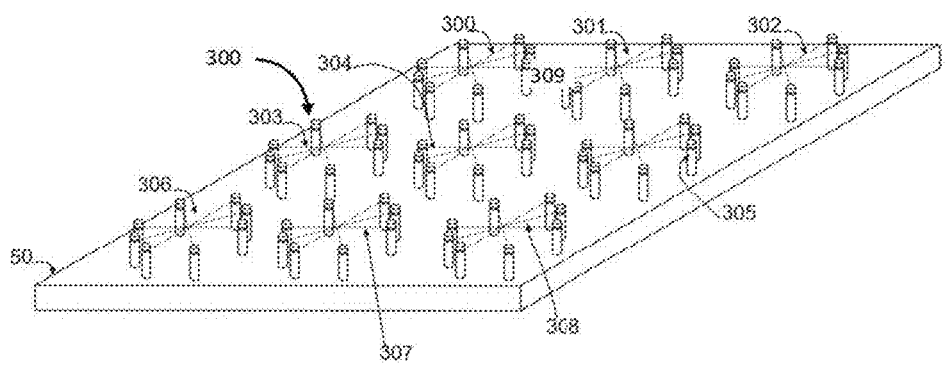
FIG. 13 is a perspective view of an alternative arrangement of the high energy beam diagnostic profiling system of FIG. 11.

As shown in FIG. 13, high energy beam profiling apparatus 300 may include an array of arrays of wires 301-309. Each wire of each array of wires 301-309 may be suspended from pillars and each array of wires 301-309 may have a substantially similar pattern to the array of overlapping wires 251-254 of high energy beam profiling apparatus 200. The array of arrays of wires 301-309 may be patterned over conductive plate 50, which may define a build area to create multiple measurement locations across conductive plate 50.

Figure 14:
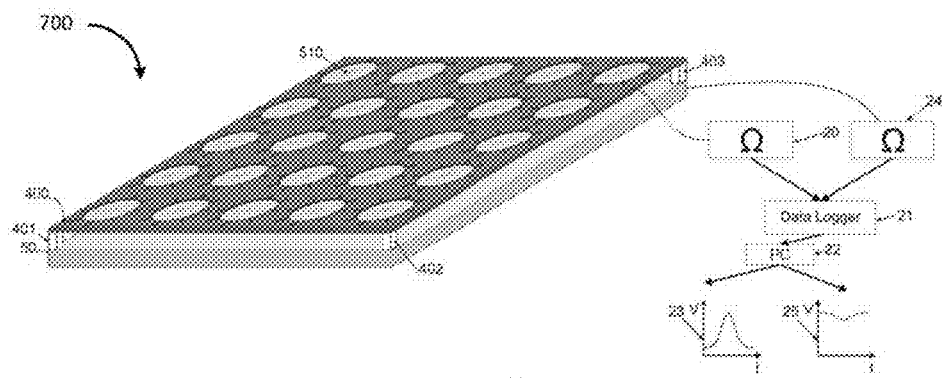
FIG. 14 is a perspective view of an alternative arrangement of the high energy beam diagnostic profiling system of FIG. 12.

As shown in FIG. 14, high energy beam profiling apparatus 700 may include an array of single measurement grids 510 formed on thin plate 410. The array 510 may be formed by an array of wires having a substantially similar pattern to that of wires 501-504 shown in FIG. 12. Like thin plate 400 in the example of FIG. 12, thin plate 410 may overlie and may be isolated from conductive plate 50 by insulating pillars 401-403 and another pillar hidden in the drawing view. The configuration of high energy beam profiling apparatus 700 may provide multiple high energy beam profiling and positional calibration locations across a build area.

Figure 15:
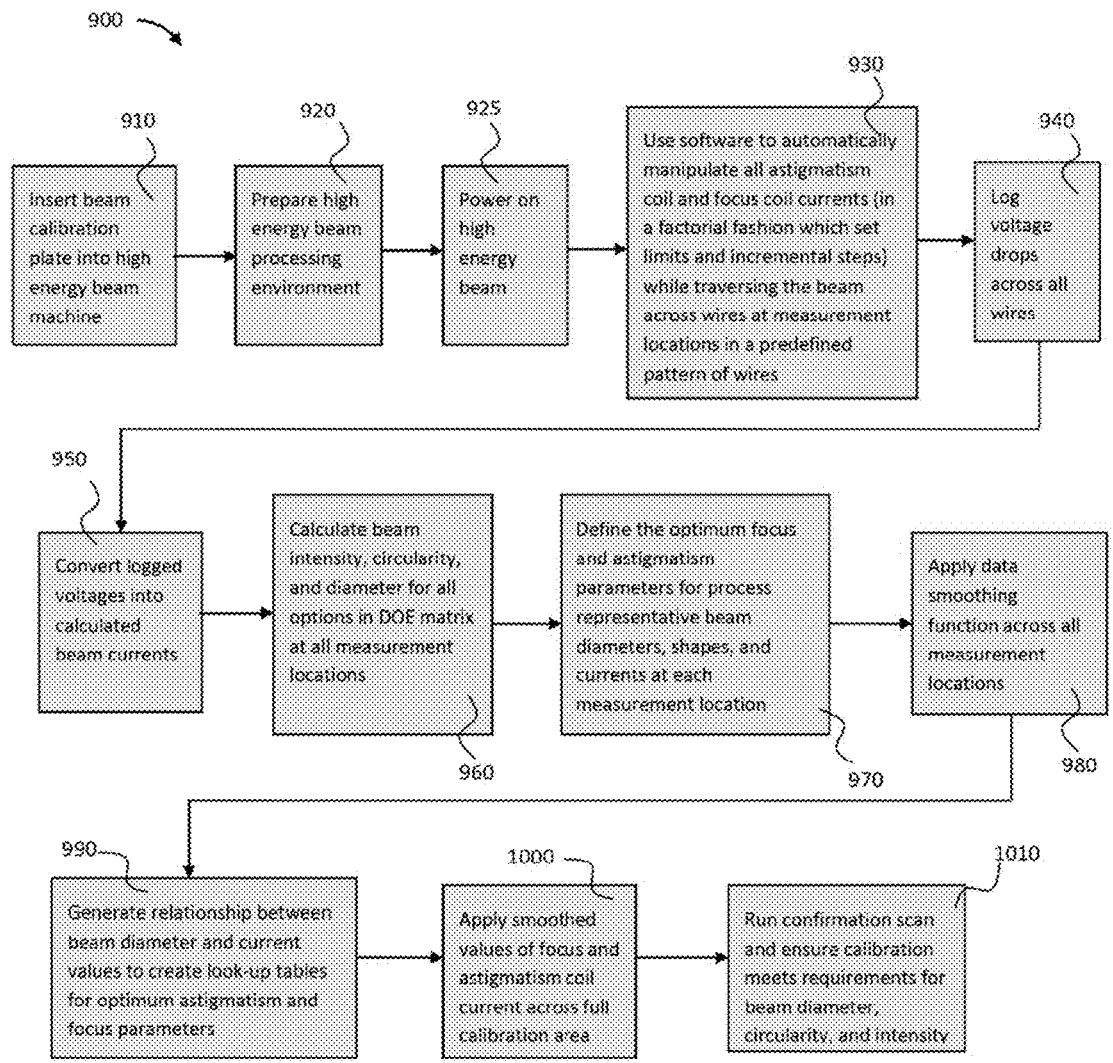
FIG. 15 is a process flow diagram of a process of calibrating a high energy beam melting system in accordance with an embodiment.

Referring now to the process flow diagram of FIG. 15 illustrating an example of an automatic beam calibration procedure 900, in accordance with an embodiment, as shown in block 910, a beam calibration plate is inserted into a high energy beam machine. In a block 920, the processing environment of the high energy beam machine is prepared, e.g., by evacuating gases contained in the machine. In a block 925, a high energy beam is powered on. In a block 930, software is used to automatically manipulate all astigmatism coil and focus coil currents (in a factorial fashion with set limits and incremental steps) while the beam is traversed across wires at measurement locations of a predefined pattern of wires. In a block 940, voltage drops across all wires are logged. In a block 950, logged voltages are converted into calculated beam currents. In a block 960, beam intensity, circularity, and diameter are calculated for all combinations of each in a design of experiments (DOE) matrix at all measurement locations. In a block 970, optimum focus and astigmatism parameters for process representative beam diameters, shapes, and currents at each measurement location are defined based on previous experimentation across multiple machines. In a block 980, a data smoothing function is applied across all measurement locations. In a block 990, a relationship between beam diameter and current values is generated, and accordingly lookup tables for optimum astigmatism and focus parameters are prepared. In a block 1000, smoothed values of focus and astigmatism coil current are applied across a full calibration area. In a block 1010, a confirmation scan may be run to ensure that the calibration meets requirements in terms of beam diameter, circularity, and intensity.

Such requirements for these parameters may vary depending on the intended use and needs of the user of the high energy beam. In some instances, the calibration process may be used to obtain any of but not limited to the smallest spot size and the most rounded spot when using the high energy beam. In some instances, constant set values for the predefined parameters may be desired at all locations of a build area whereas in other instances varying parameters may be desired across a build area.

Figure 16:
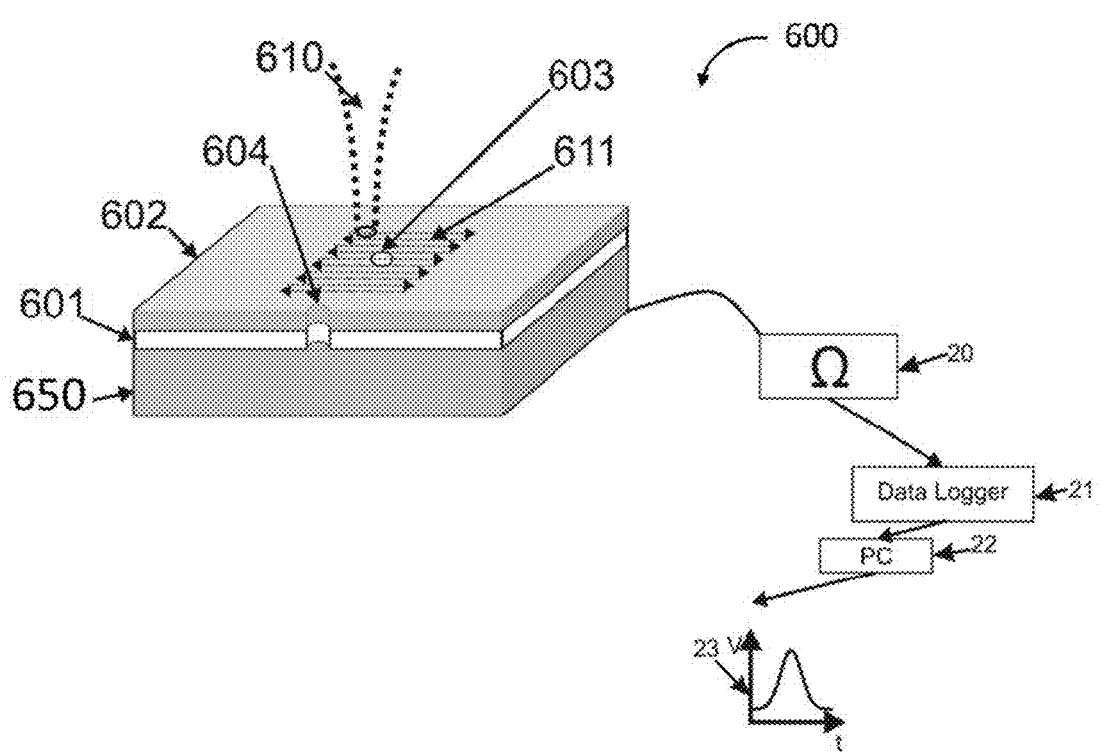
FIG. 16 is a cross-sectional perspective view of a high energy beam diagnostic profiling system in accordance with an embodiment.

Referring to FIG. 16, a high energy beam profiling apparatus 600 may include thin upper conductive plate 602 that may be separated from lower conductive plate 650 by insulating plate 601. Spaced apart small holes 603, 604 (shown in section) may extend through each of upper conductive plate 602 and insulating plate 601. As shown, small holes 603, 604 may be drilled through only upper conductive plate 602 and insulating plate 601 and not lower conductive plate 650. High energy beam 610 may be raster-scanned in a pattern 611 across holes 603A, and a voltage drop across resistor 20 of known resistance may be recorded and plotted in chart 23. By comparing information from deflection coils of high energy beam 610 with the position of highest intensity of the voltage recording in chart 23, a positional calibration of high energy beam 610 may be obtained.

Figure 17:
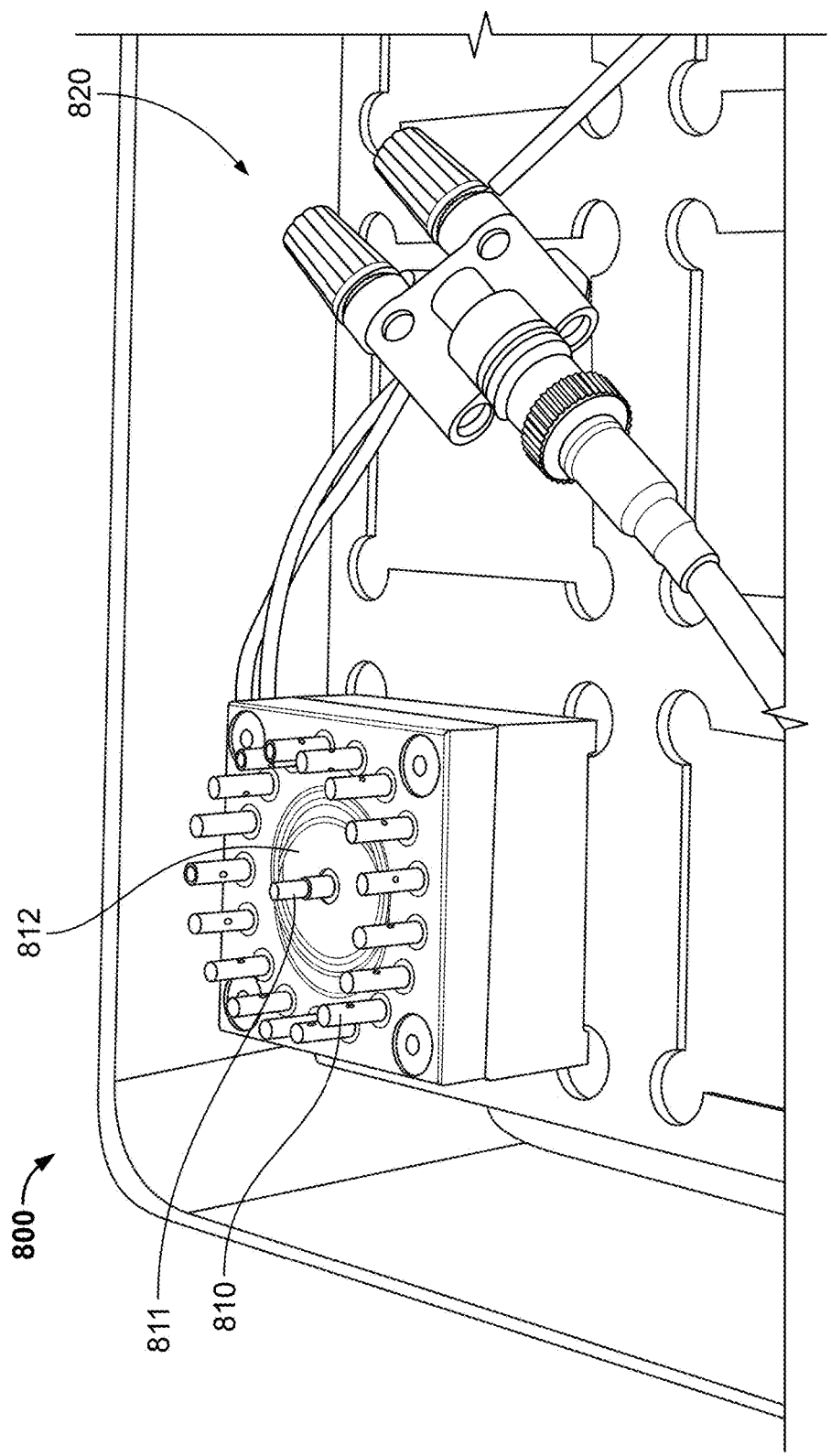
FIG. 17 is a photograph of a high energy beam diagnostic profiling system in accordance with an embodiment.
Figure 18:
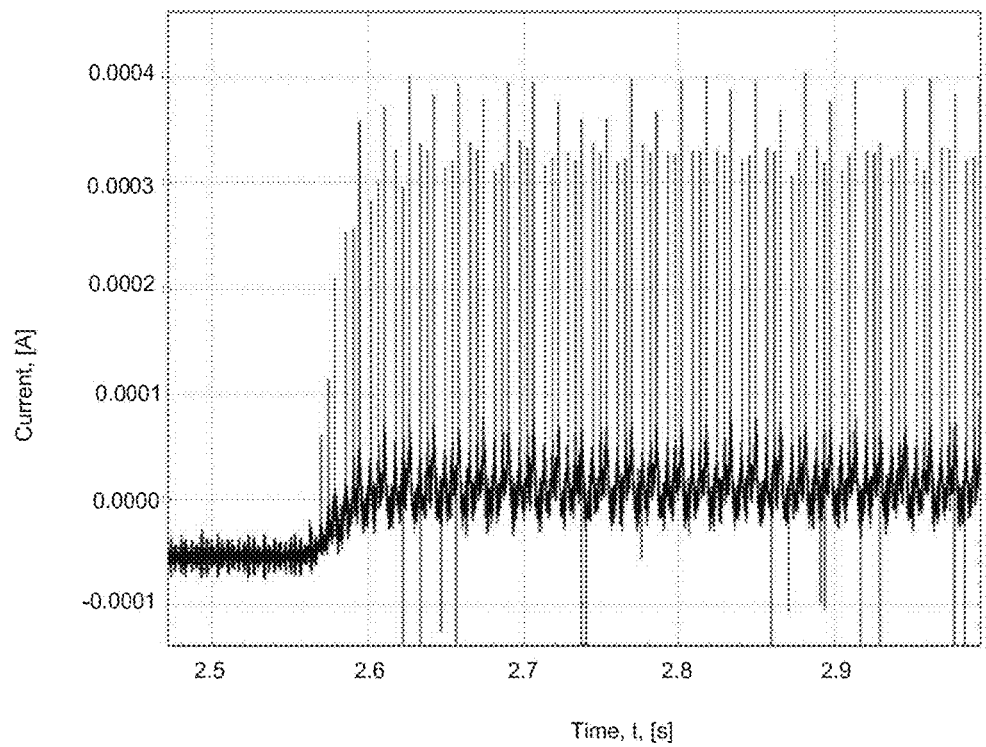
FIG. 18 is a chart showing current over a period of time as measured by the high energy beam diagnostic profiling system shown in FIG. 17.
Figure 19:
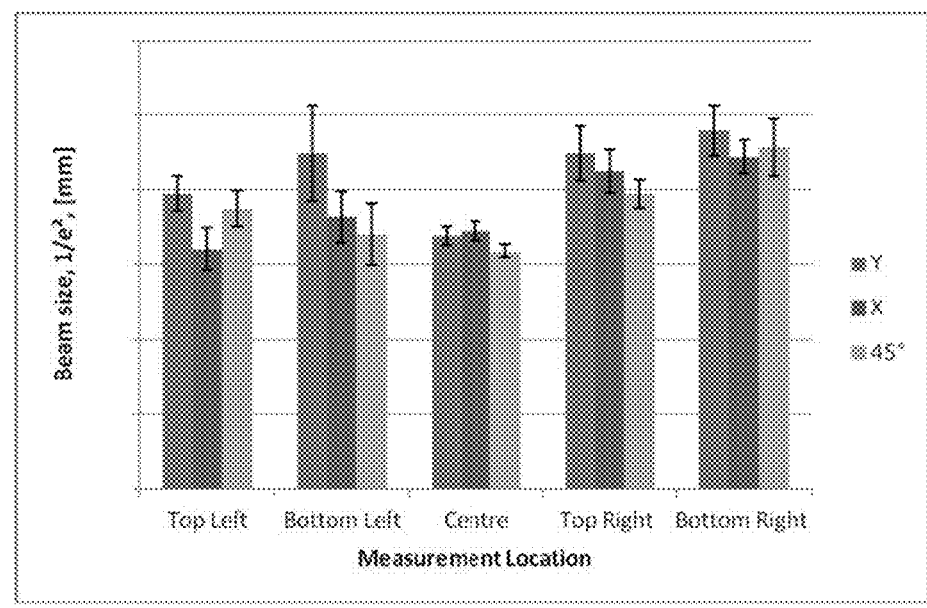
FIG. 19 is a chart showing beam size as measured in different locations and in different directions by the high energy beam diagnostic profiling system shown in FIG. 17.

As shown in FIGS. 17-19, in accordance with an embodiment, high energy beam profiling analyzer system 800 has been used in conjunction with an Arcam® A1 EBM machine. Analyzer 800 includes seventeen (17) copper pins 810 that each support tungsten wire 812. Each wire 812 extends and is attached to central pin 811. Central pin 811 is connected to ground via measurement resistor 820. Once beam profiles across the full calibration area have been generated, the profiles can be used to manually calibrate the high energy beam at specific locations across the calibration area as part of a manual calibration procedure.

FIG. 18 shows data collected from high energy beam profiling analyzer system 800 at a single analysis location. This data was generated by scanning the beam in a clockwise direction across three wires that were oriented in a first plane defined by an X-axis and a longitudinal vertical axis (z-axis) orthogonal to the X-axis and defined by central pin 811, a second plane defined by a Y-axis orthogonal to the X-axis and the vertical axis defined by central pin 811, and a third plane forming a 45° angle with the first and second planes. Although a continuous, clockwise scanning beam was used for these trials, other scan configurations may be used, such as anti-clockwise, discrete lines and any other applicable scan pattern that crosses the wires.

FIG. 19 shows compiled and analyzed data gathered by high energy beam profiling analyzer system 800 across five measurement positions. The data was manipulated to calculate the $1/e^2$ beam width at 12 mA beam current and 5000 mm/s beam speed and is plotted in the chart shown in FIG. 19. The bar chart shown provides a preliminary view as to the differences in $1/e^2$ beam width across the build/calibration area.

Although the foregoing concentrates on the profiling and calibration of an electron beam within an Arcam EBM machine, the principles disclosed are to be understood to be equally applicable to other high energy beam systems, including systems using laser and electron beam technology, where the beam is manipulated over a known area using a beam control system.

Furthermore, for any high energy beam analysis system in accordance with the present invention, the wire over which the high energy beam traverses may be placed at waist 14 of the beam, as shown for example in FIGS. 4-6, for measurement of beam parameters discussed previously herein or may be positioned such that the high energy beam is measured at any location either above or below the waist 14, such as in the examples of holes 14, 33 shown in FIG. 7.

It is to be understood that the disclosure set forth herein includes all possible combinations of the particular features set forth above, whether specifically disclosed herein or not. For example, where a particular feature is disclosed in the context of a particular aspect, arrangement, configuration, or embodiment, that feature can also be used, to the extent possible, in combination with and/or in the context of other particular aspects, arrangements, configurations, and embodiments of the invention, and in the invention generally.

Furthermore, although the invention disclosed herein has been described with reference to particular features, it is to be understood that these features are merely illustrative of the principles and applications of the present invention. It is therefore to be understood that numerous modifications, including changes in the sizes of the various features described herein, may be made to the illustrative embodiments and that other arrangements may be devised without departing from the spirit and scope of the present invention. In this regard, the present invention encompasses numerous additional features in addition to those specific features set forth in the claims below. Moreover, the foregoing disclosure should be taken by way of illustration rather than by way of limitation as the present invention is defined by the claims set forth below.

The invention claimed is:

1. A high energy beam verification, calibration, and profiling system comprising:
a conductive base plate;
a plurality of posts each extending from the base plate;
a plurality of conductors each supported by and extending from a corresponding pair of posts of the plurality of posts such that each of the conductors of the plurality of conductors is insulated from the conductive base plate, each of the conductors further having a profile intersecting with profiles of at least some of the other conductors to define a multidirectional and two-dimensional array of conductors;
a data logger electrically connected to at least one conductor to receive and record data associated with electrical charges flowing through the at least one conductor; and
a computer electrically connected to the data logger, the computer being adapted to receive, manipulate, and display the data recorded by the data logger for comparison of beam characteristics at different locations across a high energy beam build area,
wherein each of the conductors of the plurality of conductors extends from the corresponding pair of posts of the plurality of posts that is different from the corresponding pairs of posts of the plurality of posts from which the other conductors extend.

2. The system of claim 1, wherein each of the conductors is selected from the group consisting of a wire and a thin plate.

3. The system of claim 1, wherein the plurality of posts are positioned around a perimeter of the base plate in a radial configuration.

4. The system of claim 1, wherein the plurality of posts are positioned around a perimeter of the base plate in a rectangular configuration.

5. The system of claim 1, wherein at least one of the conductors extends from its corresponding pair of posts of the plurality of posts at a same height at which another of the conductors extends from its corresponding pair of posts of the plurality of posts.

6. The system of claim 1, wherein at least one of the conductors extends from its corresponding pair of posts of the plurality of posts at a different height at which another of the conductors extends from its corresponding pair of posts of the plurality of posts.

7. The system of claim 1, wherein each conductor is spaced apart from each other conductor such that the plurality of conductors are insulated from each other.

8. The system of claim 7, wherein at least one set of adjacent conductors of the plurality of conductors is spaced apart a same distance as another set of adjacent conductors of the plurality of conductors is spaced apart.

9. The system of claim 7, wherein at least one set of adjacent conductors of the plurality of conductors is spaced apart a different distance as another set of adjacent conductors of the plurality of conductors is spaced apart.

10. The system of claim 1, further comprising at least one first resistor of known resistance electrically connected to a conductor of the plurality of conductors and the data logger, wherein the data corresponds to a voltage drop measured across at least the at least one first resistor.

11. The system of claim 10, wherein at least one of the first resistors has a same resistance as another of the first resistors.

12. The system of claim 10, wherein at least one of the first resistors has a different resistance as another of the first resistors.

13. The system of claim 10, further comprising at least one second resistor of known resistance electrically connected to the conductive base plate and the data logger, wherein the data corresponds to a voltage drop measured across at least the at least one second resistor.

14. The system of claim 1, wherein at least some of the plurality of conductors are arranged in a radial pattern.

15. The system of claim 1, wherein at least first and second sets of the plurality of conductors are arranged in respective radial patterns.

16. The system of claim 1, wherein at least some of the plurality of conductors are arranged in a grid pattern.

17. The system of claim 1, wherein at least first and second sets of the plurality of conductors are arranged in respective grid patterns.

18. A method of at least one of verifying, calibrating, and profiling a high energy beam comprising:

receiving a high energy beam over a plurality of conductors within a high energy beam build area, each conductor of the plurality of conductors being supported by a corresponding pair of posts each extending from a conductive base plate such that each of the conductors is insulated from the conductive base plate, each of the conductors of the plurality of conductors further having a profile intersecting with profiles of at least some of the other conductors to define a multidirectional and two-dimensional array of conductors and extending from the corresponding pair of posts of the plurality of posts that is different from the corresponding pairs of posts of the plurality of posts from which the other conductors extend; and displaying data on a computer for comparison of beam characteristics at different locations across the high energy beam build area, the data being associated with electrical charges flowing through at least one of the conductors.

19. A high energy beam verification, calibration, and profiling system comprising:

a conductive base plate;

a support extending from the base plate;

a plurality of conductors, each conductor supported by the support such that each conductor is insulated from the conductive base plate and having a profile intersecting with profiles of at least some of the other conductors to define a multidirectional and two-dimensional array of conductors;

a data logger electrically connected to at least one conductor to receive and record data associated with electrical charges flowing through the at least one conductor; and a computer electrically connected to the data logger, the computer being adapted to receive, manipulate, and display the data recorded by the data logger for comparison of beam characteristics at different locations across a high energy beam build area, wherein the support attaches to a surface of the conductive base plate that defines a first plane, and the conductors of the plurality of conductors extend in a direction parallel to the first plane.

* * * * *